United States Patent [19]

Ikezi et al.

[11] Patent Number: 5,066,928
[45] Date of Patent: Nov. 19, 1991

[54] SOLITON PULSE COMPRESSOR

[75] Inventors: Hiroyuki Ikezi, Rancho Santa Fe; Yuh-Ren Lin-Liu, San Diego; John S. deGrassie, Encinitas, all of Calif.

[73] Assignee: General Atomics, San Diego, Calif.

[21] Appl. No.: 517,941

[22] Filed: May 2, 1990

[51] Int. Cl.⁵ .............................................. H03K 5/04
[52] U.S. Cl. ....................................... 333/20; 328/65; 328/67; 328/74
[58] Field of Search ..................... 333/20; 328/65, 67, 328/74

[56] References Cited
U.S. PATENT DOCUMENTS 4,719,429  1/1988  Ikezi et al. .............................. 333/20
4,855,696  8/1989  Tan et al. ................................ 333/20

Primary Examiner—Eugene R. LaRoche
Assistant Examiner—Tan Dinh
Attorney, Agent, or Firm—Fitch, Even, Tabin & Flannery

[57] ABSTRACT

A pulse compressor for solitons includes a continuous dispersive non-linear propagation structure so constructed so that the wavefront of an individual soliton pulse is steepened. In addition, the pulse compressor has a continuously reduced time constant on a spatial, as opposed to a temporal basis. Various structures of the pulse compressor are described.

20 Claims, 4 Drawing Sheets

SOLITON PULSE COMPRESSOR

BACKGROUND OF THE INVENTION

1. Field of the Invention

The present invention pertains to the compression of individual electromagnetic pulses, and in particular to the compression of individual soliton pulses.

2. Description of the Related Art

Commonly assigned U.S. Pat. No. 4,719,429 issued to the inventor of the present invention describes a transmission line microwave generator for generating a particular type of pulse known as a "soliton". Solitons are a class of travelling waves of interest to the scientific community. A field of study has been devoted to Solitons since the last century, the study beginning with an observation of shallow ocean waves. The term "soliton" is taken from mathematics which describe a wave shape of a non-linear pulse. Solitons are described in the book entitled, *Solitons In Action,* edited by K. Longren and A. Scott. More particularly, the present invention is concerned with a particular type of soliton, that type which satisfies the Korteweg-deVries (K-dV) equation.

The aforementioned U.S. Pat. No. 4,719,429 taught several transmission line structures having non-linear transmission characteristics and pulse dispersion characteristics, both of which are essential for producing soliton pulses. Certain applications benefit from pulse compression. For example, communication transmission lines carrying pulses are limited in their speed of operation by pulse build-up. Pulse compression would alleviate pulse build-up, thus allowing faster transmission rates.

U.S. Pat. No. 2,869,004, developed prior to soliton pulse theory and the dispersion relations necessary therefor, teaches a pulse generating electrical circuit having sequentially arranged lumped circuits with increasingly reduced time constant values. Discrete components were used to determine the time constant in successive state, and is not suitable for generating very short pulses.

Other circuits have been disclosed for modifying pulses. For example, U.S. Pat. No. 3,177,433 teaches a multistage delay line using varietur diodes in the various stages, for pulse stretching. This invention employes a temporal change of time constant instead of a spatial change. U.S. Pat. No. 3,654,419 discloses a frequency modulator circuit with lumped LC circuit elements. U.S. Pat. No. 4,707,619 discloses a particular geometry of saturable inductors. U.S. Pat. No. 2,700,114 discloses an LC network which provides impedance matching. U.S. Pat. No. 3,644,747 discloses spark gaps for replacing the saturable inductors employed in U.S. Pat. No. 2,869,004.

While generally satisfactory for their intended purposes, these circuits are not suitable for use with soliton pulses and the teachings of the above-mentioned patents do not consider soliton pulses and the need for maintaining certain circuit properties such as non-linearity and pulse dispersion, which are necessary to preserve soliton properties such as those defined by the K-dV mathematical solution. Accordingly, the need exists for obtaining spatial compression of soliton pulses in a manner which preserves the unique soliton characteristics.

SUMMARY OF THE INVENTION

It is an object, according to the present invention, to produce apparatus and methods for spatially compressing soliton pulses in a manner which preserves the soliton characteristics of the pulse.

Another object according to the present invention is to provide methods and apparatus of the above-described type which are simple and economical to implement, but which are efficient in operation.

These and other objects according to the present invention, which will become apparent from studying the appended description and drawings, is provided in a pulse compressor for soliton pulses, comprising:

a continuous double-ended body;

input terminals at one end of said body for receiving a soliton pulse having a preselected width;

output terminals at the other end of said body at which the soliton pulse is produced with a reduced temporal width;

said body defining a path between said input and said output terminals for the non-linear coupling of said soliton pulse therebetween and for selectively dispersing a portion of said pulse there along so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal.

BRIEF DESCRIPTION OF THE DRAWINGS

In the drawings, wherein like elements are referenced alike.

DETAILED DESCRIPTION OF THE PREFERRED EMBODIMENTS

Figure 1:
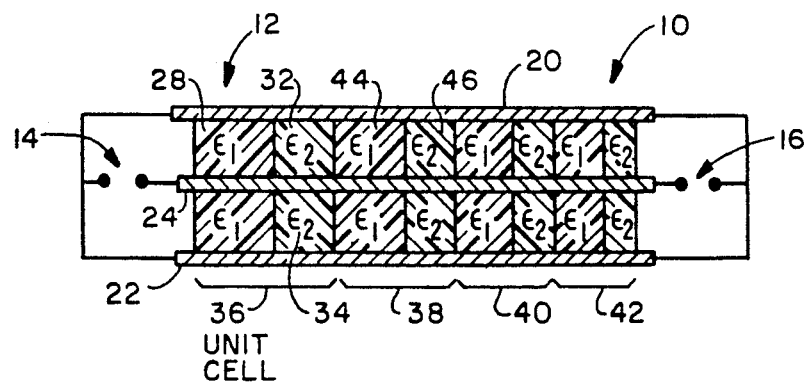
FIG. 1 is a schematic diagram of a pulse compressor embodied in a coaxial cable, taken in longitudinal cross-section and illustrating aspects of the present invention.

Referring now to the drawings, and initially to FIG. 1, the first embodiment of a soliton pulse compressor 10 constructed according to principles of the present invention will be described. As will be seen, the several pulse compressors described herein, including the compressor 10, have the important characteristics of a continuous body for transmitting a pulse wave, dispersion, a frequency dependent wave speed, a non-linear wave front steepening effect (herein an offset of the larger amplitude portion of the pulse), and a spatially (i.e., not temporally) reduced time constant.

Figure 4:
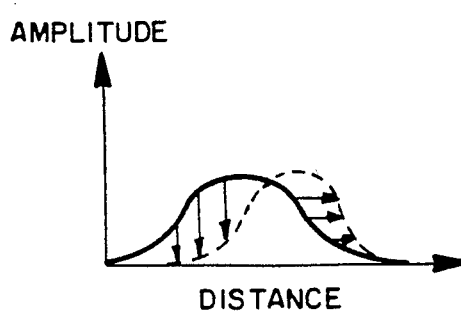
FIG. 4 is a diagram of a soliton pulse before and after pulse compression which occurs throughout the pulse compressor.
Figure 5:
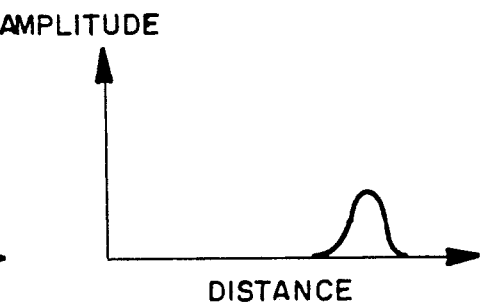
FIG. 5 is a representation of the pulse of FIG. 4 shown after pulse compression has occurred.

In the pulse compressing transmission line 10, the amplitude dependent wave velocity produces a wave front steepening effect, creating an offset of the larger amplitude portion of the pulse. The pulse appearing at the input of the compressing transmission line 10 is schematically illustrated in FIG. 4, with the rightward arrows indicating the steepening effect to occur in the transmission line, and the downward arrows indicating the dispersion effect where the pulse is terminated more quickly. FIG. 5 shows the same pulse near the end of the transmission line, with the shift having taken place as seen in the visually noticeable contraction of the pulse width. These characteristics, as will be seen, are present in optical and radio frequency embodiments of soliton pulse compressors constructed according to methods of the present invention. In addition, since the pulse compressors have a continuous body for transmitting the pulse, they may conveniently be constructed so as to have continually varying transmission characteristics as opposed to lumped constant circuits with discrete stages. This latter feature enables compression of the the pulses in a very short scale which cannot be done by lumped circuit.

Referring now to FIG. 1, pulse compressor 10 is embodied in a radio frequency transmission line having a continuous body 12 comprised of various materials through which the pulse is transmitted. The pulse compressor 10 includes input and output terminals generally indicated at 14, 16, respectively. Body 12 comprises an outer cylindrical electrode 20 constructed of a conductive material, and an inner or central electrode 24 also conductive and preferably constructed of a metal. Disposed between the center electrode 24 and the outer electrodes 20, 22 are layers of dielectric material stacked end-to-end between the input and output portions of the pulse compressor. More specifically, body 12 is comprised of a first dielectric portion 28 having a first dielectric constant $\epsilon_1$. Immediately downstream and abutted with the dielectric portion 28 is a dielectric portion 32 made of a dielectric material having a second, lower dielectric constant $\epsilon_2$. The dielectric portion 28 has a lengthwise dimension measured along the central axis of body 12. The dielectric portion 32 has a length being less than the length of the upstream portion 28.

Together, the upstream dielectric portion 28 and the downstream dielectric portion 32 comprise a first unit cell 36. Located downstream of the first unit cell 36 are unit cells 38, 40 and 42. The downstream unit cells 38-42 are constructed of the same two dielectric materials as the first unit cell 36, except that each successive unit cells has a progressively reduced length. For example, unit cell 38 has upstream dielectric portion 44 made of the same dielectric material as portion 28, but having a length less than the length of portion 28. The downstream portion 46 of unit cell 38, is made of the same dielectric material as portion 32, having a dielectric constant $\epsilon_2$ and has a length less than the length of dielectric portion 32.

In each of the unit cells, the upstream portions are made of the same dielectric material and have axial lengths that are progressively reduced from input to output end of the pulse compressor. Similarly, the downstream portions of each unit cell are made from the same dielectric material with the lengths also being progressively reduced one compared to the other, from the input to the output terminals of the pulse compressor. As a consequence, the unit cells have progressively reduced lengths between the input and output ends of the pulse compressor.

The progressive length reduction of the unit cells and of their upstream and downstream components, provide a spatially reduced time constant for the pulse compressor. Further, as noted, each unit cell is made of upstream and downstream portions having different dielectric constants, and thus the permittivity of the dielectric filling the pulse compressing transmission line is changed periodically to provide a spatially modulated path for the pulse. The non-linear effect is provided in the continuous body 12 by the field dependent permittivity characteristics of the dielectric materials used, thus providing a pulse steepening. Further, the body 12 is non-linear, with the dielectric chosen to be non-linearly field dependent. The alternation arrangement of the two dielectrics introduces the dispersion effect which depresses the back part of the pulse.

The present invention is directed to the compression of a single electromagnetic pulse in the time domain and is not concerned with the compression of pulses such as laser pulses which are comprised of a wave packet. The pulse compressor, according to principles of the present invention, is further concerned with a particular type of soliton, one defined by the Korteweg-deVries (K-dV) equation. The term "solitons", as used herein, will refer to K-dV solitons, unless specifically described otherwise. At a minimum, solitons transmitted along an electromagnetic wave transmission system require that the system provide both the non-linearity and the dispersion necessary to satisfy the Korteweg-deVries equation.

Figure 3:
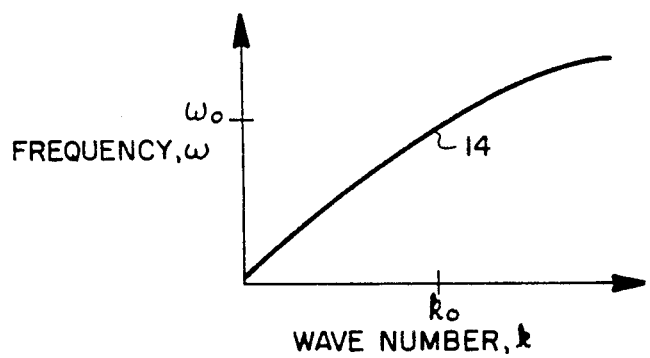
FIG. 3 is a graph illustrating the desired dispersion relationship necessary for soliton pulses.

With reference to FIG. 3, the dispersion effect can be regarded as a relationship between frequency, $\omega$, and the wave number, k. As seen in the curve 14, the frequency is linearly proportional to the wave number for small wave numbers, but deviates from the linear proportionality at $\omega > \omega_0$ and $k > k_0$. This is the wave dispersion effect. According to one aspect of the present invention, the required non-linear effect produces a wavefront steepening. As illustrated in FIG. 4, the large-amplitude part of the wave pulse is made to propagate faster than the small-amplitude part, with the large-amplitude part eventually overtaking the small-amplitude part in the manner illustrated in FIG. 5. The present invention provides soliton pulse compression in transmission systems by both non-linear steepening of the wavefront and dispersion of the selective parts of the pulse working together.

The temporal width of solitons treated according to the present invention is approximately the characteristic time constant of the transmission system given by $T = \omega_0^{-1}$, where $\omega_0$ is the characteristic frequency due to the dispersion effect, $\omega_0$ being graphically illustrated in FIG. 3. The present invention is thereby concerned with pulses which are launched so as to have a temporal width of about T at the input. According to principles of the present invention, as the soliton pulse propagates along the pulse compressor, the temporal pulse width T is reduced gradually and the soliton temporal width adjusts to the reduced local time constant, the present invention providing a propagation path having a distance dependent time constant. It has been found that pulse compressors constructed according to principles of the present invention have produced pulse width reductions to 0.001 of the original pulse width with a time constant at the output end of the propagation path approximately 0.001 of the time constant at the input end of the propagation path.

These results are accomplished in the present invention by providing, in addition to the dispersion and non-linear steepening, a spatially (as opposed to a temporally) reduced time constant. Several different realizations of pulse compressors having these characteristics will be described.

According to one aspect of the present invention, the dispersion necessary for preserving the soliton properties is provided either by periodic spatial modulation along the soliton path in the direction of soliton propagation or a non-uniformity of the propagation path in the perpendicular direction, to the exclusion of lumped circuit systems such as those described above with reference to U.S. Pat. No. 2,869,004. The pulse compressors of FIGS. 1 and 2, having coaxial cable and strip line geometries, are characterized in part by a periodic changing of the permittivity of the dielectric filling the transmission line. This periodic change introduces the dispersion effect, which is the deviation from the linear relation between $\omega$ and $\kappa$. The time constant of the pulse compressor is taken as the transit time of an electromagnetic wave across a unit cell. As indicated in FIG. 1, the length of the unit cell is reduced spatially, with the time constant also being reduced in a comparable manner.

Figure 2:
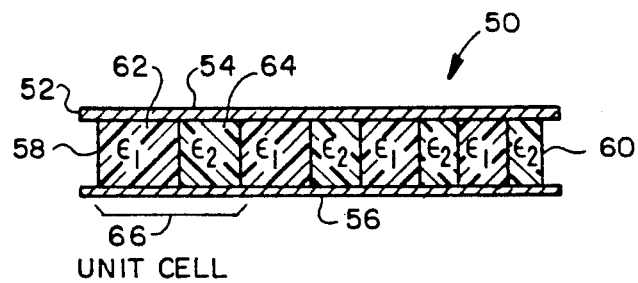
FIG. 2 is a schematic diagram of a pulse compressor embodied in a strip-line device, taken in cross-section and illustrating aspects of the present invention.

Turning now to FIG. 2, a pulse compressor generally indicated at 50 includes a transmission line structure 52 having opposed metallic conductors or plates or strips with a dielectric fill therebetween. The transmission line structure 52, also operable at radio frequencies, comprises a strip line having an input end 58 and an output end 60. The dielectric between these strips 54, 56 consists of periodically alternating series of dielectric materials having two different permittivity values. Looking, for example, at the first two sections of dielectric materials 62, 64, a unit cell 66 is formed having a maximum unit cell length as measured in the direction of soliton propagation. The next unit cell and succeeding unit cells have progressively reduced lengths in the direction of propagation. Hence, the transmission structure 52 is produced having a continuous body for propagating a soliton pulse between its input and output ends, in which the time constant is continuously reduced in the direction of propagation.

Figure 6:
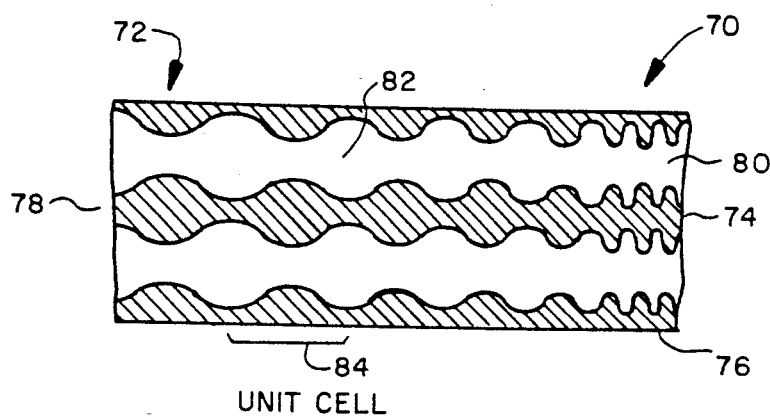
FIG. 6 is a fragmentary longitudinal cross-sectional view taken along the axial midplane of a coaxial cable, illustrating aspects according to the present invention.

Turning now to FIGS. 6-11, pulse compressors comprising transmission lines having geometric modulation of the dielectric permitting are illustrated. Referring first to FIG. 6, a transmission line generally indicated at 70 has a coaxial cable geometry. The pulse compressor 70 is embodied in a transmission structure generally indicated at 72 including inner and outer concentric conductors 74, 76, respectively. FIG. 6 is a cross-sectional view taken along the midplane of the coaxial cable structure, passing through the central longitudinal axis thereof. As can be seen in FIG. 6, the radii of the inner and outer conductors 74, 76 are both changed periodically with progressively shortened periodic intervals. The transmission structure 72 has an input end 78 and an output end 80. A dielectric material 82 fills the gap between the inner and outer conductors 74, 76. A first unit cell 84 has a length extending in the direction of pulse propagation, has length of the unit cell being defined as the distance between immediately adjacent minimum radii of the inner conductor 74, or immediately adjacent maximum internal radii of the outer conductor 76. As can be seen in the FIG. 6, the length of successive unit cells is progressively shortened.

Figure 7:
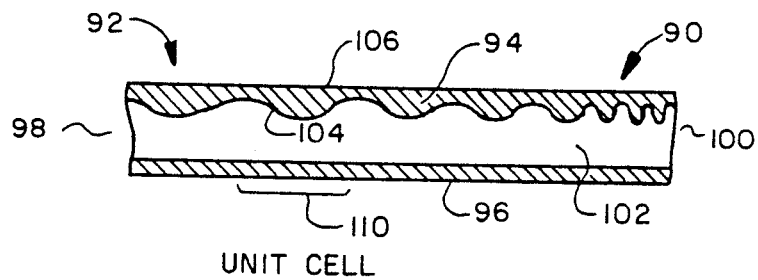
FIG. 7 is a fragmentary longitudinal cross-sectional view of a strip line embodiment of a pulse compressor according to principles of the present invention.

Referring now to FIG. 7, a pulse compressor generally indicated at 90 includes a transmission structure 92 having a strip line geometry with first and second opposed conductive strips 94, 96, respectively. The transmission structure 92 has an input end 98 and an output end 100, and a dielectric material 102 fills the gap between the first and second conductors 94, 96. In contrast to the second conductor 96 which is flat or planar in configuration, the first conductor 94 has an undulating interior surface 104 facing the second conductor 96. Conductor 94 also has an opposite outer surface 106 which preferably lies parallel to the major surfaces of the second conductor. The interior surface 104 has a geometrically modulated spacing from the second conductor 96 with geometrically alternating minimum/maximum spacings from the opposed major surface of the second conductor strip. A unit cell 110 may, therefore, be defined as the distance between immediately adjacent maximum spacing points between the conductors 94, 96. As illustrated in FIG. 7, the minimum/maximum distances between the conductor strips 94, 96 remain the same, but the length of the succeeding unit cells is progressively shortened in the direction of pulse propagation.

Figure 8:
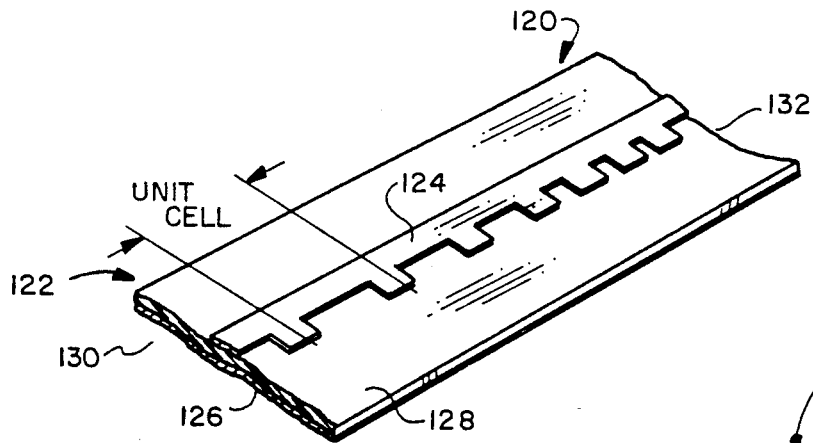
FIG. 8 is a fragmentary perspective view of another embodiment of a strip line pulse compressor constructed according to principles of the present invention.

Referring now to FIG. 8, a pulse compressor is generally indicated at 120, comprised of a transmission structure 22 having geometrically spaced alternations in the strip line width. The transmission structure 122 consists of a first, upper or notched strip of conductive material 124 and a lower strip or back plane conductor member 126. A dielectric material 128 lies between the conductors 124, 126 and provides a convenient base upon which the upper conductor 124 may be secured. As illustrated in FIG. 8, the first conductor 124 has a width alternating between constant maximum and minimum values, taking on a square-notched configuration due to notches formed in one lateral edge thereof. The transmission structure has an input end 130 and an output end 132. The transmission structure can now be seen to have a unit cell whose length extends between immediately adjacent maximum width portions of the first conductor. The length of succeeding unit cells is progressively shortened in a geometric fashion thereby providing a time constant which is spatially reduced in the direction of pulse propagation.

Figure 9:
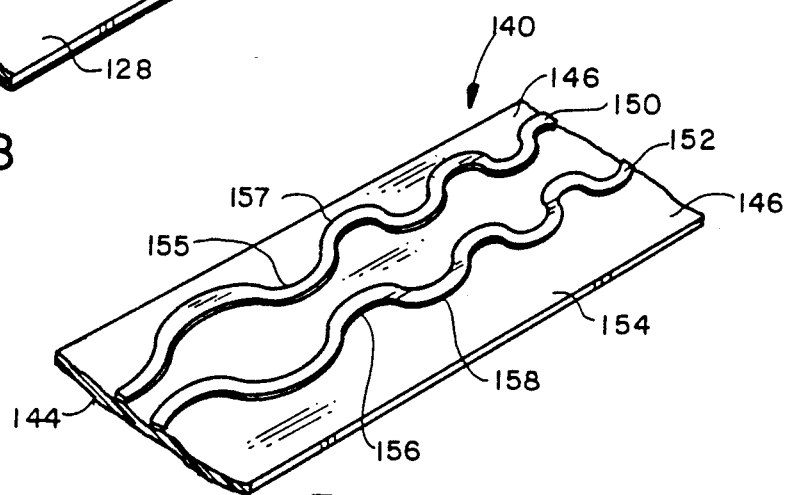
FIG. 9 is a fragmentary perspective view of a further embodiment of a strip line pulse compressor constructed according to principles of the present invention.

Referring to FIG. 9, an alternative embodiment of a pulse compressor is generally indicated at 140 having a modulated coplanar configuration with an input end 144 and an output end 146. In the coplanar strip line geometry of the transmission structure 142, both conducting elements 150, 152 are located on the same side, i.e., at the same surface of a dielectric base 154. As can be seen in FIG. 9, the conductors 150, 152 each comprise conductive strips having sinuous, preferably sinusoidal, configurations. The sinusoidal conductors 150, 152 are aligned with one another such that their points of closest excursion toward one another and their points of further excursion away from one another are directly opposite. Preferably, the amplitude of the sinusoidal shapes of conductors 150, 152 is constant, but the period of each sinusoidal shape is constantly reduced from the input end to the output end of the transmission structure.

The conducting elements 150, 152 are located side-by-side with alternating points of minimum and maximum spacing, between the conducting elements. For example, points 155, 156 on the conducting elements 150, 152, respectively are positioned immediately laterally opposite one another at a point of minimum interconductor spacing. Points 157, 158 on conducting elements 150, 152, respectively are also positioned immediately laterally adjacent one another, and are located at points of maximum interconductor spacing. In the pulse compressor 140, the conducting elements are configured such that the points of minimum spacing are constant throughout the length of the pulse compressor so that the maximum interconductor spacing is also constant. However, the separation of adjacent minimum and maximum spacings is continuously shortened along the path of a soliton pulse, thus providing a spatially reduced time constant throughout the pulse compressor.

Figure 10:
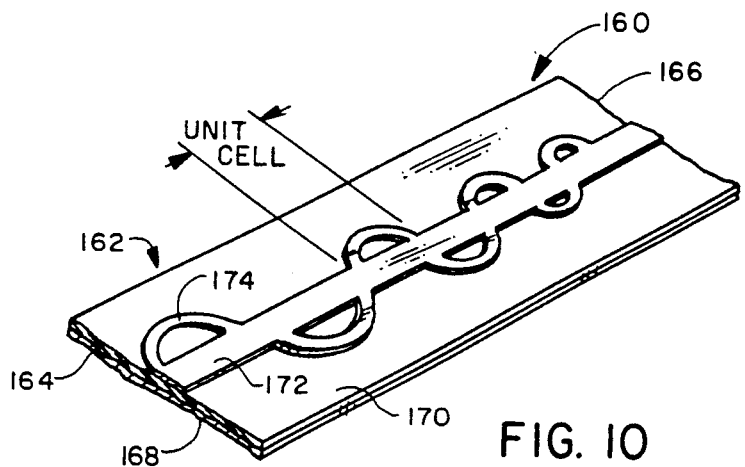
FIG. 10 is a fragmentary perspective view of a further alternative embodiment of a strip line pulse compressor according to principles of the present invention.

Referring now to FIG. 10, a pulse compressor is generally indicated at 160, including a transmission structure 162 having an input end 164 and an output end 166. The transmission structure 162 may be seen to comprise two strip lines crossing one another in a periodic fashion. A transmission structure includes a back plane conductor 168 mounted on one major surface of a dielectric base 170. Disposed on the other side of dielectric base 170 is a first straight-line strip conductor portion 172 and a second sinusoidal strip conductor portion 174 which has an alternating path intersecting the first strip conductor 172 in a periodic fashion.

In the preferred embodiment of this type of pulse compressor, the second strip conductor 174 has a generally sine wave configuration with crossing points lying along the middle of strip conductor 172. A unit cell 170 is illustrated in FIG. 10 and is defined as the distance between adjacent crossing points of the conductor strips 172, 174. In the preferred embodiment, the "sine wave" conductor portion 174 has constant amplitude values but with a progressively shortened period, or spacing between crossing points, the spacing becoming shorter in the direction of pulse propagation. If desired, the second conductor strip 174 could comprise a damped sinusoid.

The strip conductors 172, 174 are preferably formed from the same unitary conductive sheet. For example, the traces may be conveniently formed using acid-etched copper techniques as is known in the printed circuit board art. Alternatively, the conductive traces could be cut from a conductive sheet using laser cutting techniques, if desired. Less preferably, the traces could be formed from separate conductive components, one laid over the other and electrically bonded to the other, in the manner illustrated in FIG. 10.

Figure 11:
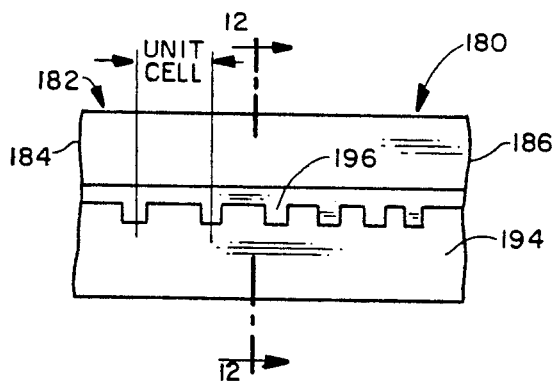
FIG. 11 is a top plan view of the pulse compressor of FIG. 8.
Figure 12:
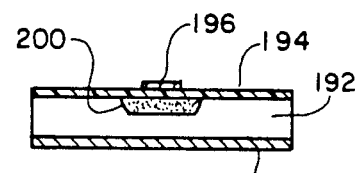
FIG. 12 is a top plan view of a further embodiment of a pulse compressor illustrating aspects of the present invention.
Figure 13:
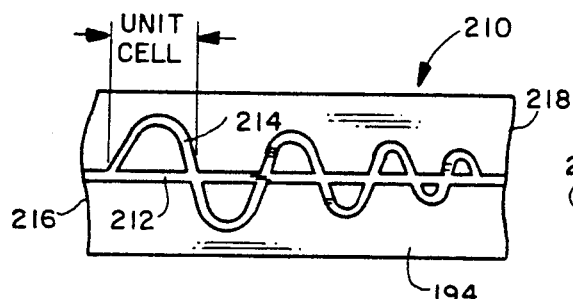
FIG. 13 is a cross-sectional elevational view taken along the line 13—13 of FIG. 10.

Turning now to FIGS. 11-13, further embodiments of a continuous body, through which soliton pulses are propagated so as to reduce their temporal width, will now be described. FIGS. 11-13 describe abrupt junction devices which provide the required non-linear steepening effect, necessary to maintain soliton properties of the pulses. Illustrated in FIG. 11 is a pulse compressor 180 embodied in a transmission structure 182, having an input end 184 and an output end 186. Referring additionally to the cross-sectional view of FIG. 12, the transmission structure 182 includes a backplane electrode 190 applied to one side of a semiconductor body 192. An insulator layer 194 is located opposite the backplane and an upper electrode 196 serves as a strip line conductor. When an electric field is applied between the strip line and backplane conductors, a depletion layer 200 is formed which operates as a non-linear element, changing the conductive dielectric permittivity of the semiconductor body 192. The upper electrode 196 resembles the aforementioned electrode 124 of FIG. 8 in that it includes alternating portions of constant minimum and maximum widths, spaced apart by notched portions of decreasing axial length, measured along the direction of pulse propagation. The electric field in the semiconductor body 192 therefor changes as the width of the upper strip line conductor 196 changes.

Referring now to FIG. 11, a pulse compressor 210 is substantially identical to the pulse compressor 160 except for a change in the strip line conductor. As before, the strip line conductor 212 extends in a generally straight line and has a constant width and thickness. However, the second strip line conductor 214 has a damped sinusoidal configuration and repeatedly crosses back and forth over the first strip line conductor 212.

The remainder of the transmission structure of pulse compressor 210 is the same as that described above with reference to FIG. 10. That is, disposed immediately below the strip line conductors 212, 214 is an upper insulator layer mounted atop a lower conductive backplane layer. As an electric field is applied to the upper strip line conductors 212, 214 a depletion layer immediately therebelow in the semiconductor material is formed changing the dielectric permittivity in accordance with the change of configuration and crossing points of the strip line conductor traces. As with the embodiment of FIG. 10, the two strip line traces can be formed in a single conductive layer which may be formed by etching, using techniques known in the printed circuit board construction art. The pulse compressor 210 has an input 216 and an output 218, with pulses being propagated therebetween through a continuous body, having a spatially varying time constant.

The semiconductor bodies of FIGS. 11-13 are preferably made of strontium-barium-titanium oxide ceramic, $Sr_xBa_{1-x}TiO_3$. If desired, impurity elements can be added. This material is especially useful for high voltage pulse compressor devices, with operating voltages typically on the order of several kilovolts. For lower voltage ranges, under 100 volts, metal-insulator-semiconductor technology may be employed. Strontium-barium-titanium oxide ceramic is a ferro-electric below the Currie temperature, $T_c$, and para-electric above $T_c$. The ferro-electric phase has hysteresis loss and the pulse attenuates.

The para-electric phase, which occurs above $T_c$, is chosen as the controlled non-linear element, decreasing the dielectric permittivity when an electric field is applied thereto, and has the added benefit of avoiding hysteresis losses. The decrease of dielectric permittivity is strong near $T_c$ and becomes weaker at higher temperatures. Preferably, the pulse compressor device using this material is operated at a temperature slightly above $T_c$. The Currie temperature depends directly on the mole fraction, x, of strontium. When x= 1, i.e., when barium is absent, $T_c$ is about 20 degrees Kelvin and when $x \approx 0.45$, $T_c$ is room temperature. However, as x is reduced, the material response time becomes longer and, accordingly, short pulses cannot be propagated through the pulse compressor. Therefore, it is desirable to have a high percentage of strontium in order to make a relativity short pulse, on the order subnanoseconds and, accordingly, operation must take place at a relatively low temperature such as that obtained in liquid nitrogen. Since it is desirable to have a continuous body for propagating a soliton pulse, use of discrete varietur diodes is avoided.

So far, we have described the devices employing either the dielectric or the depression layer of the abrupt semiconductor junction. The magnetic insulators such as ferrite and yittrium ion garnet can be employed as the non-linear material. One geometry especially adapted for use with magnetic materials is the coaxial arrangement shown in FIGS. 1 and 6.

Figure 14:
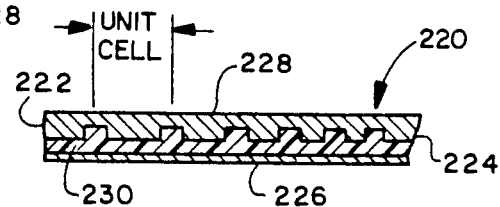
FIG. 14 is a cross-sectional view of a further embodiment of a pulse compressor constructed according to principles of the present invention.

Referring to FIG. 14, an alternative embodiment of a soliton compressor is generally indicated at 220, having an input 222 and an output 224. The transmission structure of pulse compressor 220 includes a conductive backplane 226 and an upper constant-width strip line conductor 228. Disposed between the conductors 226, 228 is a linear dielectric 230. As can be seen in the medial cross-section of FIG. 14, the upper strip line electrode 228 has a thickness ranging between a constant minimum and a constant maximum value. The distance between the minimum thickness regions is continuously shortened in the direction of pulse propagation, thus providing the desired periodic constant reduction in the time constant of the transmission structure.

For soliton pulses having a time period in the sub-picosecond range, conventional metallic conductors such as copper dissipate excessive amounts of soliton energy, and therefore, are unsuitable.

Figure 15:
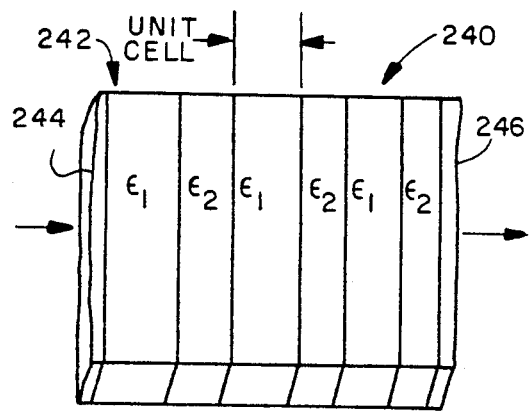
FIG. 15 is a fragmentary perspective view of a light guide pulse compressor constructed according to principles of the present invention.

In FIG. 15, the pulse compressor is generally indicated at 240 including a transmission structure 242 having an input end 244 and an output end 246. The path of propagation consists of an alternating series of dielectric materials having different dielectric constant values. The lengths of the dielectric portions, as measured in the direction of pulse propagation, is continuously shortened thus providing the spatial modulation for pulse dispersion. The continuously changing length provides a continuously reduced time constant in the direction of pulse propagation. The transverse dimension of the dielectric portions is chosen to be much larger than the spatial pulse length, typically of the order of the length of the unit cell. Thus, the soliton pulses do not escape in a transverse direction. The dielectric materials chosen are non-linear with respect to electric field strength.

Figure 16:
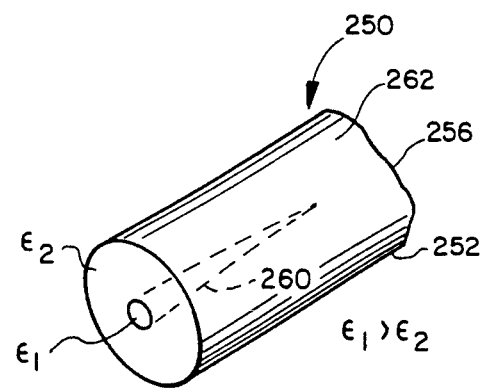
FIG. 16 is a fragmentary perspective view of a coaxial light guide pulse compressor constructed according to principles of the present invention.
Figure 17:
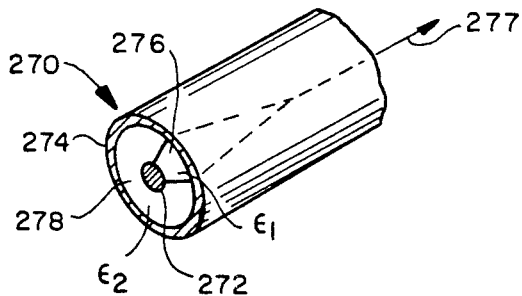
FIG. 17 is a fragmentary perspective view of another embodiment of a pulse compressor constructed according the principles of the present invention.
Figure 18:
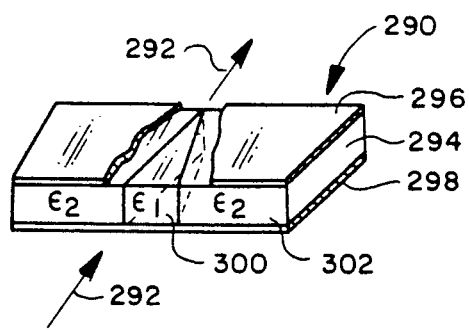
FIG. 18 is another embodiment of a light guide pulse compressor constructed according to principles of the present invention.

FIGS. 16-18, show examples of pulse compressors exhibiting perpendicularly non-uniform pulse propagation. Turning first to FIG. 16, a dielectric waveguide pulse compressor is generally indicated at 250 and includes a coaxial transmission structure 252 having an input end 254 and an output end 256. The transmission structure 252 is formed by immersing a dielectric cone 260 in a dielectric cylindrical body 262. The dielectric permittivity of the central cone 260 is chosen to be substantially greater than the dielectric permittivity of the outer surrounding cylinder 262. The propagation structure is built using conventional techniques to achieve $HE_{11}$ waveguide mode, giving the dispersion desired for soliton pulses. The time constant is the transit time of a soliton pulse across the central cone diameter and this time constant is continuously varied by tapering the diameter of the central conductor. The material of the outer cylindrical dielectric 262 is non-linear with respect to field strength. Pulse compressor 250 is expected to operate well for frequencies ranging between infrared to that of visible light.

Turning now to FIGS. 17 and 18, additional examples of perpendicularly non-uniform propagation structures will be given. Turning first to FIG. 17, a coaxial cable geometry is provided for a pulse compressor generally indicated at 270. For the pulse compressor, pulse propagation is in a direction into the plane of the drawing. Disposed between central and outer concentric conductors 272, 274 are two different types of dielectric material, having different dielectric constants. A first, wedge-shaped portion 276 has a dielectric permittivity which is greater than the dielectric permittivity of the remaining part-cylinder body 278. Portion 276 is preferably part-conical in a configuration having an upstream cross-section comprising a sector of a circle. The time constant is the transit time of the electromagnetic wave to cross the region of higher dielectric permittivity, and the time constant is varied by changing the transverse size of the wedge shaped portion 276 which has a linear downstream edge 279.

Turning now to FIG. 18, a pulse compressor 290 has a strip line configuration with pulse propagation in the direction of arrows 292. The propagation structure of pulse compressor 290 includes a central dielectric layer 294 surrounded on either side by conductive electrodes 296, 298. The central dielectric body 294 includes a central wedge-shaped portion 300 immersed in a remaining plinth-like outer body portion 302 of lower dielectric permittivity. Since the transit time of an electromagnetic wave, travelling in the direction of arrows 292, takes less time to pass through the region of higher dielectric permittivity of central wedge-shaped portion 300, a continuously reduced time constant is provided for the pulse compressor.

Turning now to FIGS. 19-21, soliton pulses exiting the pulse compressors, as described above, typically have a rounded shape such as that shown in FIG. 19. However, several applications require a square pulse, and this can be approximated by propagating two or three rounded pulses in locked-step, thus forming the shapes illustrated in FIGS. 20 and 21.

It can thus be seen that the present invention provides several embodiments of pulse compressors for propagating Korteweg-deVries soliton pulses with non-linear, wavefront steepening, pulse dispersion and a spatially reduced time constant in a continuous propagating medium embodying the active components of the pulse compressor. Dispersion has been provided in both periodically modulated propagation structures as well as propagation structures which are perpendicularly non-uniform.

The drawings and the foregoing descriptions are not intended to represent the only forms of the invention in regard to the details of its construction and manner of operation. Changes in form and in the proportion of parts, as well as the substitution of equivalents, are contemplated as circumstances may suggest or render expedient; and although specific terms have been employed, they are intended in a generic and descriptive sense only and not for the purposes of limitation, the scope of the invention being delineated by the following claims.

What is claimed is:

1. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween, said path having at least one of non-linear field-dependent permittivity and permeability along its length, and for selectively dispersing a portion of said pulse therealong so as to steepen the wavefront of said soliton pulse with an amplitude dependent speed as the pulse travels between said input and said output ends;
said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal.

2. The apparatus of claim 1 wherein said transmission path has a time constant which is reduced exponentially as the pulse travels from input end to output end.

3. The apparatus of claim 1 wherein said body comprises a coaxial cable with inner and outer conductors and said dielectric components therebetween, the thickness of the inner and outer conductors varying periodically with length, with portions of maximum and minimum thicknesses opposite one another, and the distance between adjacent maximum thickness portions decreasing from input end to output end.

4. The apparatus of claim 1 wherein said body comprises a strip line transmission line with two opposing conductive plates and a dielectric layer therebetween, at least one plate having a periodically varying thickness.

5. The apparatus of claim 1 wherein said body comprises a strip lien transmission line with two opposing conductive plates and a dielectric layer therebetween including periodically spaced depletion regions.

6. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal; and
said transmission path comprises an alternating sequence of first and second dielectric components having different dielectric constants, the lengths of said dielectric components decreasing from input end to output end.

7. The apparatus of claim 6 wherein said body comprises a coaxial cable with inner and outer conductors and said dielectric components therebetween.

8. The apparatus of claim 6 wherein said body comprises a strip line transmission line with first and second spaced planar conductors and said dielectric components therebetween.

9. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal; and
said body comprises a strip lien transmission line with first and second spaced planar conductors and said dielectric components therebetween, the thickness of one conductor varying periodically with length, with portions of maximum and minimum thicknesses decreasing from input end to output end.

10. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal; and said body comprises a strip line transmission line with a first wider and a second narrower planar conductor spaced apart by intervening dielectric components, the width of the second conductor varying with geometrically spaced alternations, the distances between portions of successive maximum widths decreasing from input end to output end.

11. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal; and
said body comprises a strip line transmission line with a first wider and a second narrower planar conductor spaced apart by intervening dielectric components, the second conductor having opposed lateral edges, at least one of which is notched with a periodic series of notches, with distances between notches varying periodically with length.

12. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal; and
said body comprises a strip line transmission line with a first and a second planar conductor in opposed relationship and spaced apart by intervening dielectric components, the first conductor comprising an axially extending strip intersected by a sinusoidal strip coplanar therewith, the period of the sinusoidal strip decreasing from input end to output end.

13. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal; and
said body comprises a coaxial transmission line with inner and outer coaxial conductors whose thickness varies periodically with length, portions of successive maximum and minimum thickness opposite one another, with the distances between portions of successive maximum thickness decreasing from input end to output end.

14. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporarily compressed soliton pulse at said output terminal; and
said body comprises an alternating series of first and second dielectric materials having different dielectric constants, the dielectric materials of said series being progressively shortened i the direction of pulse propagation.

15. A pulse compressor for soliton pulses, comprising:
a continuous double-ended body;
input terminals at line end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal; and
said body comprises an inner, at least partial cone body, having a first dielectric constant surrounded by an outer body having a second dielectric constant so as to render pulse propagation therethrough perpendicularly non-uniform.

16. The apparatus of claim 15 wherein said first body has an upstream end with a circular sector cross-section.

17. The apparatus of claim 15 wherein said inner body is generally conical, having a reduced cross-section remote from an input end thereof.

18. A pulse compressor for soliton pulses, comprising:
a continuous double-ended body;
input terminals at one end of said body for receiving a soliton pulse having a preselected width;
output terminals at the other end of said body at which the soliton pulse is produced with a reduced temporal width;
said body defining a path between said input and said output terminals for the non-linear coupling of said soliton pulse therebetween and for selectively dispersing a portion of said pulse therealong so as to steepen the wavefront of said soliton pulse, said path having a progressively reduced, spatially reduced time constant, so as to compress the soliton pulse travelling between said input and said output terminals so as to progressively compress the time length of the soliton pulse in a manner to produce a temporally compressed soliton pulse at said output terminal; and
said body comprises a wedge-shaped central portion having a first dielectric constant disposed within an outer body comprising a plinth of dielectric material having a second dielectric constant.

19. The apparatus of claim 18 wherein said central portion and said outer body are disposed between a pair of generally planar electrodes to form a strip line transmission line therewith.

20. The apparatus of claim 18 wherein said central portion has generally triangular surfaces adjacent the electrodes.

* * * * *

UNITED STATES PATENT AND TRADEMARK OFFICE
CERTIFICATE OF CORRECTION

PATENT NO. : 5,066,928
DATED : November 19, 1991
INVENTOR(S) : Hiroyuki Ikezi, et al.

It is certified that error appears in the above-identified patent and that said Letters Patent is hereby corrected as shown below:

In Column 1, lines 15-16, change "Solitons" to read --solitons--.

In Column 1, line 45, change "employes" to read --employs--.

In Column 3, line 17, change the semicolon ";" to a period --.--.

In Column 3, line 52, delete "the" (second occurrence).

In Column 4, line 47, change "alternation" to read --alternative--.

In Column 6, line 11, change "permitting" to read --permittivity--.

In Column 6, line 58, change "alternations" to read --alternatives--.

In Column 7, line 53, change "!70" to read --170--.

In Column 9, line 25, change "relativity" to read --relatively--.

In Column 9, line 25, after the word "order" insert --of--.

UNITED STATES PATENT AND TRADEMARK OFFICE
CERTIFICATE OF CORRECTION

PATENT NO. : 5,066,928

DATED : November 19, 1991

INVENTOR(S) : Hiroyuki Ikezi, et al.

It is certified that error appears in the above-identified patent and that said Letters Patent is hereby corrected as shown below:

In Column 11, line 59 (Claim 5), change "lien" to read --line--.

In Column 12, line 44 (Claim 9), change "lien" to read --line--.

In Column 14, line 43 (Claim 14), change "i" to read --in--.

In Column 14, line 47 (Claim 15), change "line" to read --one--.

Signed and Sealed this

Thirteenth Day of April, 1993

Attest:

STEPHEN G. KUNIN

*Attesting Officer*     *Acting Commissioner of Patents and Trademarks*